United States Patent [19]

Ekins

[11] Patent Number: 4,954,831

[45] Date of Patent: Sep. 4, 1990

[54] ANALOG-TO-DIGITAL CONVERTER

[76] Inventor: Robin K. Ekins, Elkins; Robin K., Fort Lauderdale, Fla. 33312

[21] Appl. No.: 284,798

[22] Filed: Dec. 13, 1988

Related U.S. Application Data

[63] Continuation of Ser. No. 875,550, Jun. 18, 1986, abandoned.

[51] Int. Cl.$^5$ ............................................. H03M 1/36
[52] U.S. Cl. ...................................... 341/159; 307/362
[58] Field of Search ....................... 341/158, 159, 160; 307/360, 362

[56] References Cited

U.S. PATENT DOCUMENTS

| | | | |
|---|---|---|---|
| 2,688,441 | 9/1954 | Merrill et al. | 340/347 AD |
| 3,537,101 | 10/1970 | Campanella et al. | 340/347 AD |
| 3,611,350 | 10/1971 | Leibowitz et al. | 340/347 AD |
| 4,075,511 | 2/1978 | Lewis | 307/270 |
| 4,211,999 | 7/1980 | Clark et al. | 340/347 M |
| 4,274,016 | 6/1981 | Ghahramani | 307/362 |
| 4,596,978 | 6/1986 | Fujita | 340/347 M |

Primary Examiner—William M. Shoop, Jr.
Assistant Examiner—Marc S. Hoff
Attorney, Agent, or Firm—Joseph Zallen

[57] ABSTRACT

An analog-to-digital converter having: (1) a quantization stage which received an analog input signal and has separate output terminals for different threshold levels; (2) a discriminator stage for exclusively using the highest threshold output terminal of the quantization stage to produce on a a corresponding output terminal of the discriminator stage a signal of one binary logic state, all the other output terminals of the discriminator stage having the opposite binary logic state; and (3) an encoder stage connected between the output terminals of the discriminator stage and a smaller number of digital data output terminals to produce a pure binary number which represents the output terminal of the discriminator stage that is at the one binary logic state.

28 Claims, 2 Drawing Sheets

ANALOG-TO-DIGITAL CONVERTER

This is a continuation of patent application Ser. No. 875,550, filed June 18, 1986 by the applicant, which application is now abandoned.

This invention relates to an analog-to-digital converter.

Present day analog-to-digital converters are relatively complex, and this complexity contributes to disadvantageous operating characteristics. The present invention is directed to an analog-to-digital converter of extreme simplicity which is capable of real time operation without any of the disadvantages associated with previous analog-to-digital converters. The present invention has virtually no built-in time delay, no external processing, no counting and virtually no errors.

This invention has three principal stages:

(1) A quantization or threshold detector stage for receiving the analog input signal and determining which of a series of successively higher threshold values it exceeds. This stage has a separate output terminal for each threshold value. Every output terminal whose threshold value is exceeded has one binary logic state and all the remaining output terminals have the opposite binary logic state.

(2) A discriminator stage for exclusively using the highest threshold valued output terminal of the quantization stage which has the one binary logic state. The discriminator stage has the same number of output terminals as the quantization stage. Only the output terminal of the discriminator stage which corresponds to the exclusively used output terminal of the quantization stage is activated to a particular binary logic state. All the other output terminals of the discriminator stage have the opposite binary logic state.

And (3) An encoder connected between the output terminals of the discriminator stage and several digital data output terminals weighted to provide a pure binary number which represents the discriminator stage output terminal that is at said one binary logic state and thus corresponds to instantaneous magnitude of the analog input signal to the quantization stage.

Preferably, the quantization stage includes a plurality of resistors connected in parallel between the analog signal input terminal and ground and having individual taps which provide different percentages of the total analog input signal voltage. Each of these taps is connected individually to the enable input terminal of a corresponding analog switch having a pair of normally-open terminals, one of which is grounded and the other of which is an output terminal of the quantization stage. Thus, the quantization stage is a multi-level threshold detector in which each output terminal corresponds to a particular threshold level.

Alternatively, the quantization stage may comprise a plurality of comparators which have operational amplifiers which compare the voltage of the analog input signal to respective reference voltages which provide different threshold levels.

Preferably, the discriminator stage includes a plurality of two-input NOR gates, each having one of its inputs connected individually to a corresponding analog switch in the quantization stage and its other input connected through an inverter to the next higher threshold analog switch in the quantization stage. Depending on the instantaneous magnitude of the analog input signal to the quantization stage, not more than one of these NOR gates will have a first binary logic state at its output and all the other NOR gates will have the opposite binary logic state at their respective outputs. The one NOR gate which has the first binary logic state at its output corresponds to the threshold at or just below the instantaneous magnitude of the analog input signal to the quantization stage.

Preferably, the encoder stage consists of a multiplicity of inverters connected between the NOR gate outputs of the discriminator stage and a group of digital data output terminals such that the combination of binary signals on the digital data output terminals represents the one NOR gate in the discriminator stage which has said first binary logic state at its output.

A principal object of this invention is to provide a novel analog-to-digital converter of extreme simplicity and excellent reliability.

Another object of this invention is to provide such an analog-to-digital converter which is capable of real time operation with virtually no time delay in converting the instantaneous analog input signal to a digital output signal.

Another object of this invention is to provide a novel analog-to-digital converter in which the digital output synchronously tracks the analog input.

Another object of this invention is to provide a novel analog-to-digital converter which has no sampling and no control signals or clocks involved in its operation.

Further objects and advantages of this invention will be apparent from the following detailed description of three presently preferred embodiments which are illustrated schematically in the accompanying drawings.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

DETAILED DESCRIPTION

Figure 1:
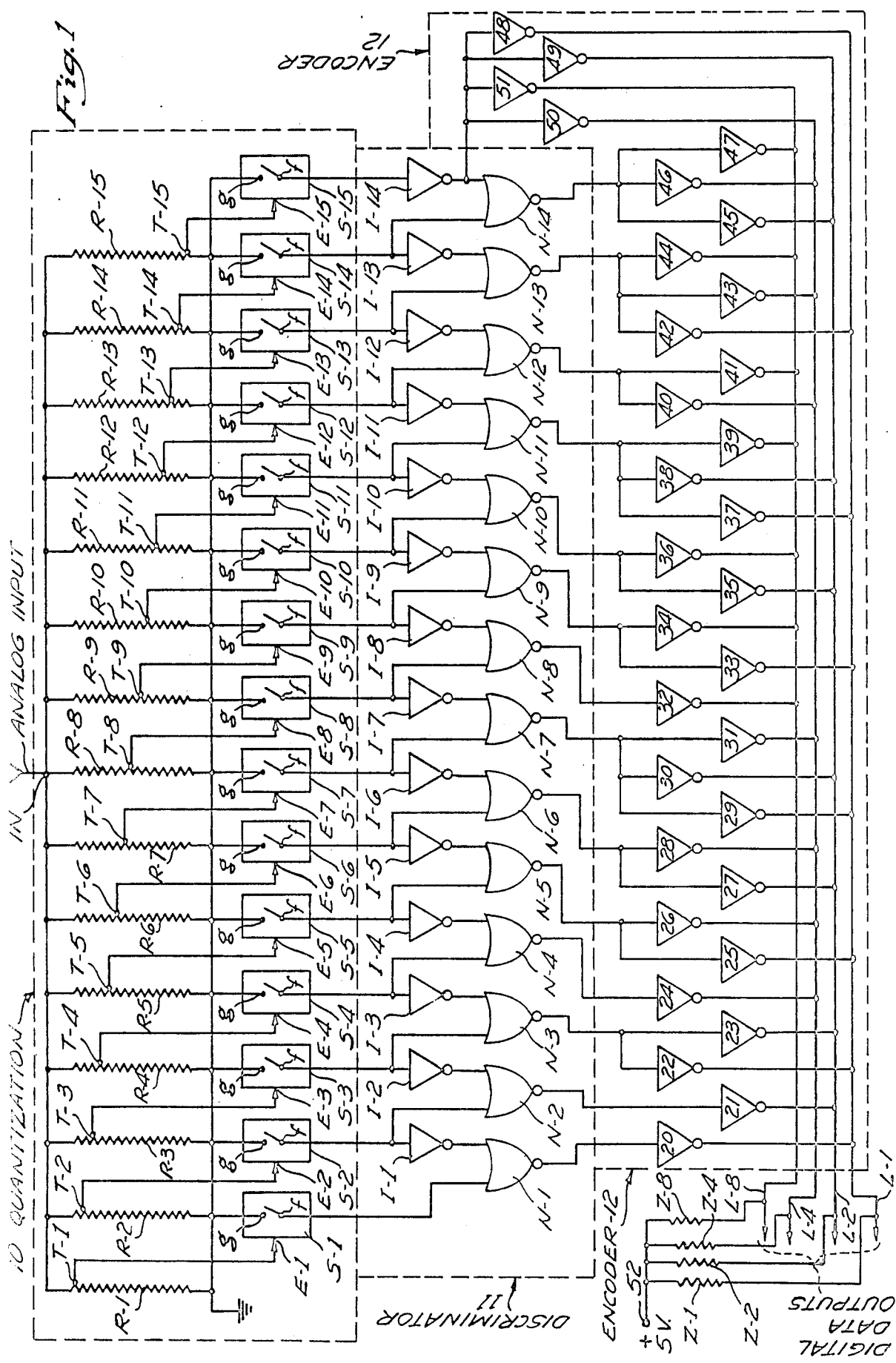
FIG. 1 is a schematic circuit diagram of a first embodiment of the invention.

Referring to FIG. 1, in broad outline this embodiment of the present analog-to-digital converter has in succession a quantization stage 10 which receives the analog input signal and has a plurality of potentiometers or voltage dividers and high speed analog switches, a discriminator stage 11 which tells which of the now-closed analog switches corresponds to the instantaneous analog input voltage, and an encoder stage 12 for converting the output from the discriminator stage 11 to a digital output signal which corresponds to the instantaneous analog input signal.

In the particular embodiment shown the quantization stage 10 has fifteen resistors R-1, R-2, R-3, R-4, R-5, R-6, R-7, R-8, R-9, R-10, R-11, R-12, R-13, R-14, and R-15 connected in parallel with each other between the analog input terminal IN and ground. These resistors have respective taps T-1, T-2, etc. at different positions therealong to provide individual voltages which decrease in successive even steps from R-1 to R-15. For a given instantaneous analog input signal voltage, the voltage on T-1 will be the same as that of the analog input voltage, on T-2 it will be 14/15 of that input voltage, on T-3 it will be 13/15 of that input voltage, and so on in even steps until the final resistor R-15 where the voltage on T-15 will be 1/15 of the instantaneous analog input signal voltage. This relationship holds true whatever the magnitude of that analog input signal voltage. Thus, each resistor R and its tap T constitutes a potentiometer, or voltage divider, for developing a voltage which is a predetermined percentage of the instantaneous analog input voltage.

The tap T-1 on first resistor R-1 is connected to the enable input terminal E-1 of a first analog switch S-1, the tap T-2 on second resistor R-2 is connected to the enable input terminal E-2 of a second analog switch S-2, the tap T-3 on third resistor R-3 is connected to the enable input terminal E-3 of a third analog switch S-3, the tap T-4 on fourth resistor R-4 is connected to the enable input terminal E-4 of a fourth analog switch S-4, the tap T-5 on the fifth resistor R-5 is connected to the enable input terminal E-5 of a fifth analog switch S-5, the tap T-6 on the sixth resistor R-6 is connected to the enable input terminal E-6 of a sixth analog switch S-6, the tap T-7 on the seventh resistor R-7 is connected to the enable input terminal E-7 of a seventh analog switch S-7, the tap T-8 on the eighth resistor R-8 is connected to the enable input terminal E-8 of an eighth analog switch S-8, the tap T-9 on the ninth resistor R-9 is connected to the enable input terminal E-9 of a ninth analog switch S-9, the tap T-10 on the tenth resistor R-10 is connected to the enable input terminal E-10 of a tenth analog switch S-10, the tap T-11 on the eleventh resistor R-11 is connected to the enable input terminal E-11 of an eleventh analog switch S-11, the tap T-12 on the twelfth resistor R-12 is connected to the enable input terminal E-12 of a twelfth analog switch S-12, the tap T-13 on the thirteenth resistor R-13 is connected to the enable input terminal E-13 of a thirteenth analog switch S-13, the tap T-14 on the fourteenth resistor R-14 is connected to the enable input terminal E-14 of a fourteenth analog switch S-14, and the tap T-15 on the fifteenth resistor R-15 is connected to the enable input terminal E-15 of a fifteenth analog switch S-15.

Each analog switch S-1, S-2 etc. preferably is a 4066 CMOS integrated circuit chip which is a quad bilateral switch having many other practical applications and available from several sources in the U.S., for example, the ECG 4066B quad bilateral switch shown on page 155 of the ECG Replacement Guide, published by ECG (Sylvania). As shown schematically in FIG. 1, each of these analog switches has normally-open terminals g and f which become conductively connected to each other when a control voltage of high enough magnitude appears on the enable input terminal E of that switch. Terminal g of each analog switch is grounded, so when that switch closes, its terminal f becomes grounded. All the analog switches have the same minimum switch-closing voltage on the respective enable input terminal E.

It will be evident that it require a higher analog input signal voltage at input terminal IN to cause the second analog switch S-2 to close than the input signal voltage required to close the first analog switch S-1. Also, it requires a higher analog input signal voltage at input terminal IN to cause the third analog switch S-3 to close than what is required to cause the second analog switch S-2 to close. This relationship holds true for each of the higher numbered switches in succession. Thus, the potentiometers or voltage dividers R-1, T-1, etc. and the analog switches S-1, etc. together constitute a multi-level or stepped threshold detector for determining the instantaneous magnitude of the analog input voltage as measured by the voltage setting of the next lower voltage step or threshold in the threshold detector.

It is to be understood that the just-described multiple potentiometer and analog switch arrangement is merely illustrative of one possible embodiment. If desired, the steps between successive voltage thresholds can be unequal or based on a non-linear scale, such as logarithmic. Also, there may be a minimum analog input voltage required to close the lowest threshold analog switch.

When any particular analog switch closes, all of the lower numbered switches will be closed, also. For example, an analog input signal voltage on terminal IN with an instantaneous amplitude large enough to cause switch S-4 to close will also cause switches S-3, S-2 and S-1 to close. The f terminals of the analog switches are the output terminals of the quantization stage 10 of the present analog-to-digital converter. The output signal from the quantization stage is in the nature of a cumulative decimal number in that the highest threshold analog switch that is closed represents the magnitude of this number and all the lower threshold analog switches also are closed. Only the highest threshold analog switch that is closed is significant in defining the number that comes out of the quantization stage.

The discriminator stage 11 of the present analog-to-digital converter comprises a plurality of NOR gates N-1, N-2 ... N-14 and input inverters I-1, I-2 ... I-14.

The f terminal of each analog switch S-1, S-2, ... S-14 (except the last switch S-15) is connected directly to one input terminal of a correspondingly numbered NOR gate, N-1, N-2, N-3, N-4, N-5, N-6, N-7, N-8, N-9, N-10, N-11, N-12, N-13, or N-14. This is the left-hand input terminal of each NOR gate in FIG. 1.

The second (right-hand) input terminal of each NOR gate is connected through a corresponding inverter to the f terminal of the next higher numbered analog switch. Thus, a first inverter I-1 is connected between the f terminal of the second analog switch S-2 and this input terminal of the first NOR gate N-1, a second inverter I-2 is connected between the f terminal of the third analog switch S-3 and this input terminal of the second NOR gate N-2, a third inverter I-3 is connected between the f terminal of the fourth analog switch S-4 and this input terminal of the third NOR gate N-3, a fourth inverter I-4 is connected between the f terminal of the fifth analog switch S-5 and this input terminal of the fourth NOR gate N-4, a fifth inverter I-5 is connected between the f terminal of the sixth analog switch S-6 and this input terminal of the fifth NOR gate N-5, a sixth inverter I-6 is connected between the f terminal of the seventh analog switch S-7 and this input terminal of the sixth NOR gate N-6, a seventh inverter I-7 is connected between the f terminal of the eighth analog switch S-8 and this input terminal of the seventh NOR gate N-7, and eighth inverter I-8 is connected between the f terminal of the ninth analog switch S-9 and this input terminal of the eighth NOR gate N-8, a ninth inverter I-9 is connected between the f terminal of the tenth analog switch S-10 and this input terminal of the ninth NOR gate N-9, a tenth inverter I-10 is connected between the f terminal of the eleventh analog switch S-11 and this input terminal of the tenth NOR gate N-10, an eleventh inverter I-11 is connected between the f terminal of the twelfth analog switch S-12 and this input terminal of the eleventh NOR gate N-11, a twelfth inverter I-12 is connected between the f terminal of the thirteenth analog switch S-13 and this input terminal of the twelfth NOR gate N-12, a thirteenth inverter I-13 is connected between the f terminal of the fourteenth analog switch S-14 and this input terminal of the thirteenth NOR gate N-13, and a fourteenth inverter I-14 is connected between the f terminal of the fifteenth analog switch S-15 and this input terminal of the fourteenth NOR gate N-14.

Each of the NOR gates N-1 through N-14 preferably is a 74SO2 quad two-input NOR gate of the Shottky type. Such NOR gates are standard items available from several sources in the U.S., for example, NOR gates as shown on page 4-5, "Fairchild TTL Logic". Each inverter I-1 through I-14 preferably is a 74SO4 common emitter inverter integrated circuit chip available from several U.S. sources, for example, as shown on pages 4-7, "Fairchild TTL Logic".

Alternatively, the NOR gates may be type 74FO2, in which case the inverters will be type 74FO4.

The NOR gates N-1 through N-14 and the input inverters I-1 through I-14 make up the discriminator stage of the present analog-to-digital converter. The output terminals of the discriminator stage are the output terminals of NOR gates N-1, N-2, ... N-14 and the output terminal of inverter I-14. The function of this stage is to select the highest threshold analog switch S-1 through S-15 which is now closed in response to the instantaneous amplitude of the analog input signal at input terminal IN.

In the operation of this discriminator stage, if the analog input signal at the input terminal IN is so small that only analog switch S-1 is closed, the left-hand input terminal of NOR gate N-1 will be grounded (logic state low) and its right-hand input terminal will be low because the first input inverter I-1 reverses the polarity of the signal on the now-open terminal f of the second binary switch S-2. With both inputs low, the first NOR gate N-1 produces a logic high signal on its output terminal. All the higher numbered NOR gates, N-2, N-3, etc., which correspond to successively higher thresholds, will have a low signal on their respective output terminals because each of these NOR gates has a high signal on its left-hand input and a low on its right-hand input.

As another example, if the analog input signal at the converter's input terminal IN has a high enough amplitude to close the third analog switch S-3 and the first and second switches S-1 and S-2, the output terminal of the third NOR gate N-3 will go high because both inputs to this NOR gate are low (the left-hand input from the now-grounded terminal f of the third analog switch S-3, and the right hand input through the third inverter I-3 from the now-open terminal f of the fourth analog switch S-4). At this time the output terminals of the first and second NOR gates N-1 and N-2 are both low because each of these NOR gates has its left-hand input low (from the now-grounded terminal f of the correspondingly number analog switch S-1 or S-2) and its right-hand input high (from the correspondingly numbered inverter I-1 or I-2). The output terminals of all the other NOR gates N-4, N-5 ... N-14 are low. Therefore, the high output appears only at the NOR gate N-3 of the same number as the highest threshold analog switch S-3 that is closed at this time. Thus, the number of the single NOR gate whose output is high represents a decimal number that identifies the highest-threshold analog switch that is closed, which corresponds to the closest threshold voltage below (or at) the instantaneous amplitude of the analog input signal voltage at terminal IN.

The same type of operation occurs whatever may be the instantaneous amplitude of the analog input signal voltage. The highest threshold analog switch to be closed (all the lower-threshold analog switches also being closed) causes a high to appear at the output of the correspondingly numbered NOR gate, while all the remaining NOR gates have a low output.

The encoder section 12 of the present A/D converter has a plurality of output inverters connected between the output terminals of the NOR gates, N-1, N-2 ... N-14, and the output of inverter I-14 and four digital output terminals or lines L-1, L-2, L-4, and L-8, which have decimal number weights of 1, 2, 4 and 8, respectively. These include:

an inverter 20 between the output of the first NOR gate N-1 and line L-1;
an inverter 21 between the output of the second NOR gate N-2 and line L-2;
an inverter 22 between the output of the third NOR gate N-3 and line L-1;
an inverter 23 between the output of N-3 and line L-2;
an inverter 24 between the output of the fourth NOR gate N-4 and line L-4;
an inverter 25 between the output of the fifth NOR gate N-5 and line L-1;
an inverter 26 between the output of N-5 and line L-4;
an inverter 27 between the output of the sixth NOR gate N-6 and line L-2;
an inverter 28 between the output of N-6 and line L-4;
an inverter 29 between the output of the seventh NOR gate N-7 and line L-1;
an inverter 30 between the output of N-7 and line L-2;
an inverter 31 between the output of N-7 and line L-4;
an inverter 32 between the output of the eighth NOR gate N-8 and line L-8;
an inverter 33 between the output of the ninth NOR gate N-9 and line L-1;
an inverter 34 between the output of N-9 and line L-8;
an inverter 35 between the output of the tenth NOR gate N-10 and line L-2;
an inverter 36 between the output of N-10 and line L-8;
an inverter 37 between the output of the eleventh NOR gate N-11 and line L-1;
an inverter 38 between the output of N-11 and line L-2;
an inverter 39 between the output of N-11 and line L-8;
an inverter 40 between the output of the twelfth NOR gate N-12 and line L-4;
an inverter 41 between the output of N-12 and line L-8;
an inverter 42 between the output of the thirteenth NOR gate N-13 and line L-1;
an inverter 43 between the output of N-13 and line L-4;
an inverter 44 between the output of N-13 and line L-8;
an inverter 45 between the output of the fourteenth NOR gate N-14 and line L-2;
an inverter 46 between the output of N-14 and line L-4;

an inverter 47 between the output of N-14 and line L-8;

an inverter 48 between the output of inverter I-14 (at the output side of analog switch S-15) and line L-1;

an inverter 49 between the output of I-14 and line L-2;

an inverter 50 between the output of I-14 and line L-4;

and an inverter 51 between the output of I-14 and line L-8.

In one practical embodiment each of the inverters 20–51 is a type 74SO5 hex inverter with open collector output, for example, as shown on page 4–8, "Fairchild TTL Logic". The open collector output characteristic enables the outputs of these inverters to be tied together, such as the several inverter outputs connected to each of the output lines L-1, L-2, L-4 and L-8. Each of the output lines L-1, L-2, L-4, and L-8 is connected through a corresponding resistor Z-1, Z-2, Z-4 or Z-8 to a +5 volt power supply terminal 52.

Alternatively, the encoder could be made up of NOR gates instead of the inverters 20–51.

With this arrangement, four different conditions of the analog switches and the binary signals on the output terminals L-8, L-4, L-2 and L-1 are as shown in the following table:

| HIGHEST NUMBERED SWITCH CLOSED | L-8 | L-4 | L-2 | L-1 |
| --- | --- | --- | --- | --- |
| no switch closed | H | H | H | H |
| S-1 | H | H | H | L |
| S-2 | H | H | L | H |
| S-3 | H | H | L | L |
| S-4 | H | L | H | H |
| S-5 | H | L | H | L |
| S-6 | H | L | L | H |
| S-7 | H | L | L | L |
| S-8 | L | H | H | H |
| S-9 | L | H | H | L |
| S-10 | L | H | L | H |
| S-11 | L | H | L | L |
| S-12 | L | L | H | H |
| S-13 | L | L | H | L |
| S-14 | L | L | L | H |
| S-15 | L | L | L | L |

Thus, the present converter provides sixteen different combinations of binary signals on the four output lines L-1, L-2, L-4 and L-8, providing a true logic (or hexadecimal) output which corresponds to the analog input within an accuracy of less than one binary digit. That is, the worst case would be where the analog input signal is just slightly less than what is required to close the next higher threshold analog switch.

The resolution and dynamic range of this analog-to-digital converter can be increased by increasing the number of successive threshold sub-circuits in the quantization stage 10, increasing the number of NOR gates and inverters in the discriminator stage 11, and increasing the number of inverters and output terminals in the encoder 12. For example, if there are to be 8 output terminals of the encoder stage, there will be 256 threshold levels in the quantization stage, and correspondingly increased numbers of inverters and NOR gates in the discriminator stage and inverters in the encoder. Thus, the same architecture of this digital-to-analog converter can be used to provide an 8-bit, 12-bit, 16-bit or more digital data output.

Figure 2:
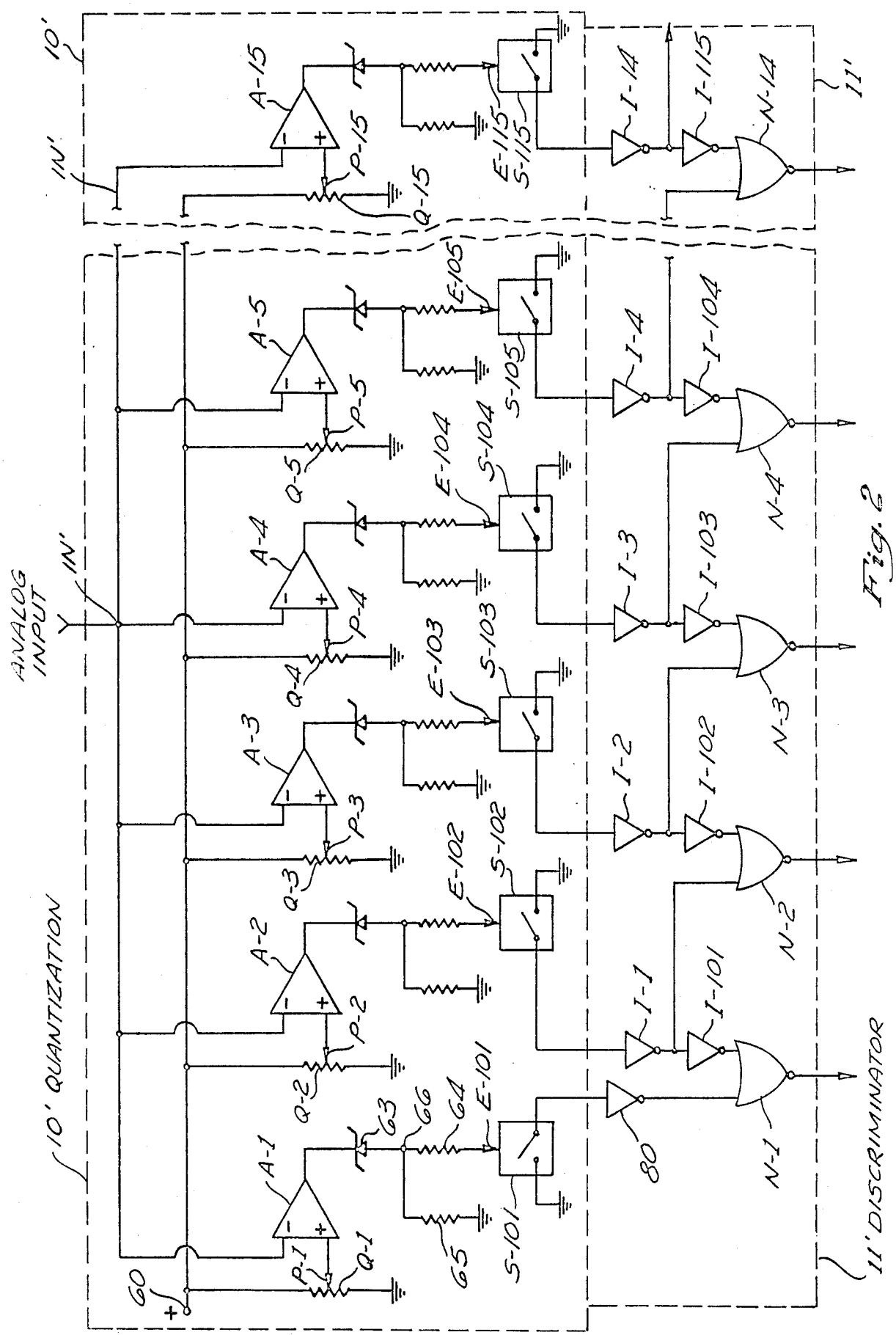
FIG. 2 is a similar circuit diagram showing parts of a second embodiment of the invention.

FIG. 2 shows the first two stages of a second embodiment of the present invention. The quantization stage 10' in FIG. 2 is different from the quantization stage 10 in FIG. 1. The discriminator stage 11' in FIG. 2 differs from the discriminator stage 11 in FIG. 1. The encoder stage in this second embodiment (not shown in FIG. 2) is identical to the encoder 12 in FIG. 1.

In place of the potentiometers and analog switches in the quantization stage 10 of FIG. 1, the quantization stage 10' of FIG. 2 has a plurality of comparators, one for each different threshold value that is to be detected.

The lowest threshold comparator comprises an operational amplifier A-1 having its inverting input terminal connected directly to the analog signal input terminal IN'. The non-inverting input terminal of this op amp is connected to a potentiometer tap P-1 on a resistor Q-1 connected between a positive power supply terminal 60 for the op amp and ground. A Zener diode 63 and a resistor 64 are connected in series between the output of the op amp and the enable input terminal E-101 of a first analog switch S-101 of the CMOS type. A resistor 65 is connected between the juncture 66 of Zener diode 63 and resistor 64 and ground.

The setting of potentiometer tap P-1 determines the minimum value of the analog input voltage at input terminal IN' that is necessary to cross the lowest-valued threshold. When the instantaneous value of the analog input voltage exceeds the reference voltage on P-1 the output of the operational amplifier goes low. The Zener diode 63 and resistor 64 act as an interface or signal conditioner to allow transitions to take place in later stages.

The quantization stage 10' has additional operational amplifiers A-2, A-3, A-4 . . . A-15 for establishing successively higher threshold values. The inverting input terminal of each of these op amps is connected directly to the analog signal input terminal IN'. The non-inverting input terminal of each of these op amps is connected to an adjustable tap on a corresponding potentiometer. For example, the non-inverting input terminal of op amp A-2 is connected to tap P-2 on resistor Q-2, one terminal of which is connected to the power supply terminal 60 and the other of which is grounded. The taps P-2, P-3, etc. on successively higher numbered potentiometers are set to provide successively higher thresholds.

The ungrounded terminal of analog switch S-101 is connected through an inverter 80 to the left-hand input terminal of the first NOR gate N-1 in the discriminator stage 11' in FIG. 2.

When the analog input signal on input terminal IN' exceeds the threshold voltage set by P-1, the output of the first op amp A-1 goes low. This puts a low on the enable input terminal E-101 of analog switch S-101, so this switch is open, putting a high on the input of inverter 80 and a low on its output, which is applied to the left-hand input terminal of NOR gate N-1. If the analog input signal does not exceed the second threshold voltage, set by P-2, the output of the second op amp A-2 will be high, putting a switch-closing high on the enable input terminal E-102 of the second analog switch S-102. With switch S-102 closed, it puts a low on the right-hand input terminal of NOR gate N-1 through the series-connected inverters I-1 and I-101. The output of N-1 is high because both of its input are low. This high is applied to the input of inverter 20 in the encoder stage, as shown in FIG. 1.

With switch S-102 closed, as described, the left-hand input of the second NOR gate N-2 is high because of the action of inverter I-1. Consequently the output of N-2 is low.

All of the higher numbered analog switches S-103, S-104 ... S-115 are closed under the condition assumed, namely that the analog input signal exceeds only the first threshold. Consequently, the left-hand input terminal of each of the corresponding NOR gates N-3, N-4 ... N-15 will be high, and the output of each of these NOR gates will be low.

As another example, when the amplitude of the analog input signal on input terminal IN' exceeds the third threshold, as set by P-3, but not the fourth threshold, as set by P-4, then op amps A-1, A-2 and A-3 will all have low outputs and the remaining op amps A-4, A-5 ... A-15 will have high outputs. Consequently, the first three analog switches S-101, S-102 and S-103 will be open and all the other, higher numbered analog switches S-104, S-105 ... S-115 will be closed. With switch S-102 open, there will be a high on the right-hand input terminal of NOR gate N-1, so the output of N-1 will be low. With switch S-103 open, there will be a high on the right-hand input terminal of NOR gate N-2, so the output of N-2 will be low. Because switch S-3 is open there is a low on the left-hand input terminal of NOR gate N-3, and because switch S-104 is closed there is a low on the right-hand input terminal of N-3, so its output will be high and this is applied to the inputs of inverters 22 and 23 in the encoder stage, shown in FIG. 1. S-104 puts a high on the left-hand input terminal of NOR gates N-5, so the output of this NOR gate is low. All of the higher numbered analog switches S-105, etc., are closed and each of them puts a high on the left-hand input terminal of the NOR gate numbered with the same decimal number as the last numeral of that switch, for example, switch S-105 puts a high on the left-hand input terminal of NOR gate N-5, so the output of N-5 is low.

Thus, not more than one of the several NOR gates in the discriminator stage 11' has a high output, and this is the NOR gate whose number corresponds to the highest threshold level exceeded by the instantaneous voltage of the analog input signal. Thus, the modified quantization and discriminator stages 10' and 11' in FIG. 2 combine to produce the same results as the corresponding stages 10 and 11 in FIG. 1 and they may be used with the encoder stage 12 shown in FIG. 1.

Figure 3:
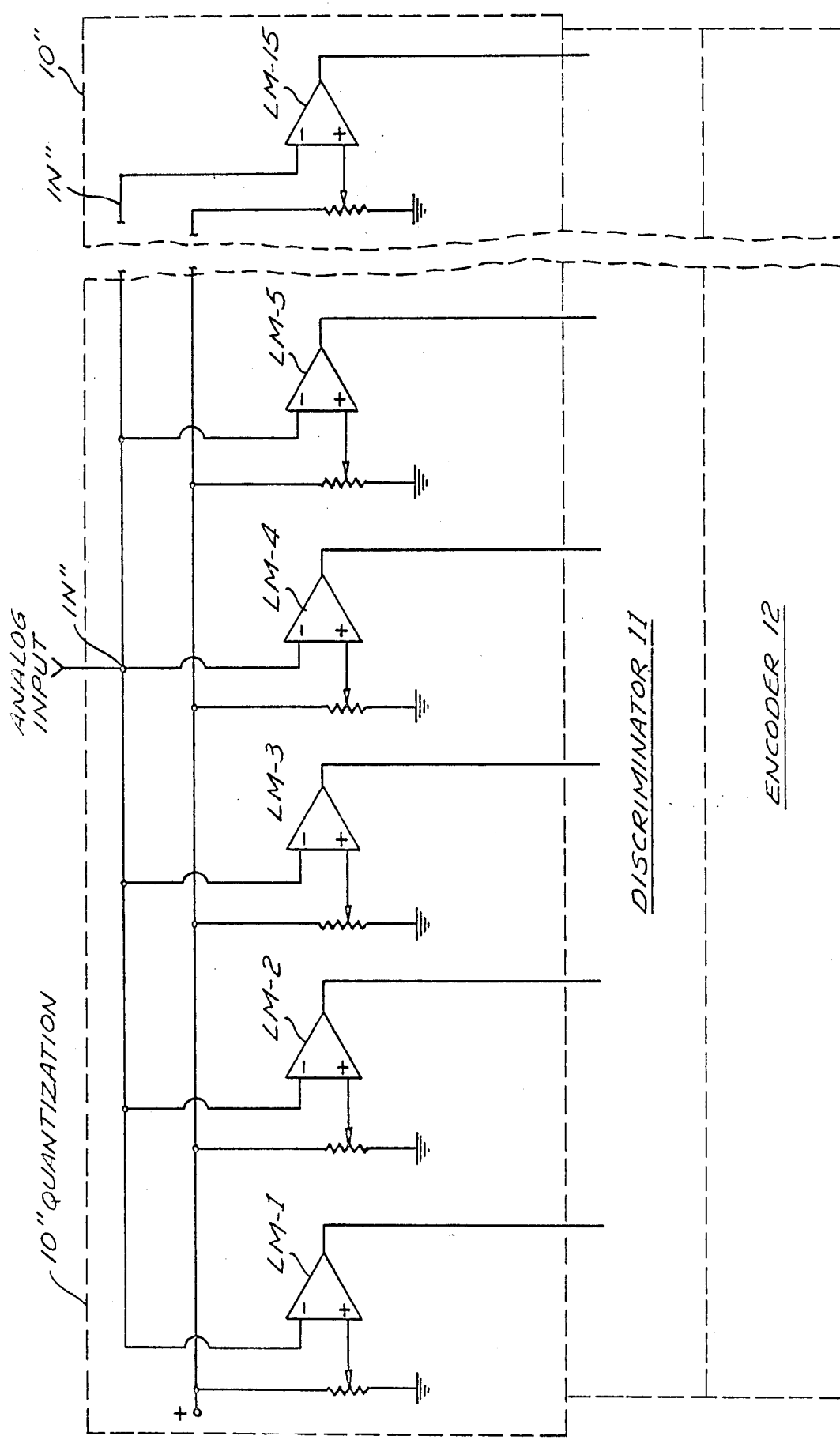
FIG. 3 is a circuit diagram showing part of a third embodiment of this invention.

FIG. 3 shows a third embodiment of the invention having a quantization stage 10" different from both the quantization stage 10 in FIG. 1 and the quantization stage 10' in FIG. 2, and having a discriminator stage 11 and an encoder stage 12 identical to those stages in FIG. 1. Because of this identity, the discriminator and encoder stages 11 and 12 are not shown in detail in FIG. 3.

In FIG. 3 the quantization stage 10" has a plurality of operational amplifiers of the type known as the LM 339 comparator, sold by National Semiconductor Corporation, which has an output that is compatible with TTL. The LM 339 comparator is described at page 5-27 of the Linear Databook (1984) of National Semiconductor Corporation. These op amps are designated LM-1, LM-2, LM-3 ... LM-15, with the numeral corresponding to the threshold level. The inverting input terminal of each of these op amps is connected directly to the analog signal input terminal IN". The non-inverting input of each op amp is connected to an adjustable tap on a corresponding potentiometer in the same manner as in FIG. 2. In these respects, the quantization stage 10" of FIG. 3 is identical to the quantization stage 10' of FIG. 2.

FIG. 3 differs from FIG. 2 in that the outputs of the op amps LM-1, LM-2 ... LM-15 are connected directly to the input lines of the discriminator stage 12 shown in FIG. 1. For example, the output of LM-1 is connected directly to the left-hand input terminal of NOR gate N-1, the output of LM-2 is connected to the input of inverter I-1 in FIG. 1 and to the left-hand input terminal of NOR gate N-2, and the output LM-3 is connected to the input of inverter I-2 and to the left-hand input terminal of NOR gate N-3.

The operation of the op amps LM-1, LM-2, etc. in the quantization stage 10" of FIG. 3 is such that for any given analog input signal amplitude each op amp whose threshold is exceeded by the analog input signal produces a low output with enough current to drive the TTL load, and each op amp whose threshold is higher than the analog input signal produces a high output.

A significant advantage of this converter is its virtually instantaneous response to changes in the magnitude of the analog input signal because none of the circuit elements has a significant time delay when called upon to change from one logic state to another. Therefore, the digital output "tracks" the analog input very effectively.

Another advantage of this converter is the simplicity of its circuitry and its use of integrated circuit chips of proven reliable performance characteristics.

I claim:

1. An analog-to-digital converter which does not require a clock and which requires the three following stages, namely:

(a) A separate, discrete, quantization stage including an analog signal input terminal,
a plurality of output terminals corresponding individually to different analog input signal magnitudes on said input terminal,
and means connected between said input terminals and said output terminals for producing a first binary logic state on only those output terminals which correspond to signal magnitudes not greater than the instantaneous analog input signal magnitude and for producing the opposite binary logic signal state on all the other output terminals of the quantization stage;

(b) A separate, discrete, discriminator stage having a plurality of output terminals,
means connected between the output terminals of the quantization stage and the output terminals of the discriminator stage for producing an output signal of one binary logic state on the output terminal of the discriminator stage which corresponds to a particular magnitude range of the analog input signal on said analog signal input terminal of the quantization stage and for producing output signals of the opposite binary logic stage on all the other output terminals of the discriminator stage; and means for providing several digital data output terminals; and (c) a separate, discrete, encoder stage operatively connected between said output terminals of the discriminator stage and said digital data output terminals to provide different possible combinations of binary logic states on said digital data output terminals, depending upon which one of said output terminals of the discriminator stage has the output signal of said binary one logic state.

2. An analog-to digital converter according to claim 1 wherein said means connected between said input terminal and said output terminals of the quantization stage comprise:
a plurality of voltage dividers connected in parallel between said analog signal input terminal and ground and providing different percentages of the total analog input signal voltage;
and a plurality of normally-open analog switches connected in parallel between ground and said output terminals of the quantization stage, each of said analog switches having an enable input terminal connected to a corresponding voltage divider and operable to close said switch when the voltage provided by said voltage divider exceeds a certain magnitude.

3. An analog-to-digital converter according to claim 2 wherein each of said analog switches is a quad bilateral switch.

4. An analog-to-digital converter according to claim 1 wherein said means connected between said analog signal input terminal and said output terminals of the quantization stage comprise:
a plurality of potentiometers connected in parallel and providing different threshold voltages;
and a plurality of voltage comparators, each operatively connected individually to a corresponding potentiometer to compare the instantaneous analog input signal voltage with the threshold voltage established by said corresponding potentiometer and to respond if the analog signal input voltage exceeds the threshold voltage established by that potentiometer, each of said comparators having an output terminal operatively connected to a corresponding output terminal of the quantization stage.

5. An analog-to-digital converter according to claim 4 wherein each of said voltage comparators comprises:
an operational amplifier having an inverting input terminal, a non-inverting input terminal and an output terminal, means operatively connecting said input terminals of each operational amplifier respectively to the analog signal input terminal and the corresponding potentiometer and means operatively connecting the output terminal of each operational amplifier to the corresponding output terminal of the quantization stage.

6. An analog-to-digital converter according to claim 5 wherein said means comparator operatively connecting the output terminal of each operational amplifier to the corresponding output terminal of the quantization stage comprises:
a Zener diode and a first resistor in series between the output terminal of said operational amplifier and said output terminal of the quantization stage;
and an additional resistor connected between ground and the juncture of said Zener diode to said first resistor.

7. An analog-to-digital converter according to claim 5 wherein:
each of said operational amplifiers is TTL compatible;
and each of said operational amplifiers has its output terminal connected directly to the corresponding output terminal of the quantization stage.

8. An analog-to-digital converter according to claim 1 wherein said discriminator stage comprises:
a plurality of NOR gates, one less than the number of said output terminals of the quantization stage;
and a plurality of inverters operatively connected to inputs of said NOR gates;
said NOR gates and said inverters being operatively connected to said output terminals of the quantization stage to produce an output signal of one binary logic state on a single output terminal of the discriminator stage which corresponds to a particular amplitude range of the analog input signal voltage on said analog signal input terminal and to produce output signals of the opposite binary logic state on all the other output terminals of said discriminator stage.

9. An analog-to-digital converter according to claim 2 wherein said discriminator stage comprises:
a plurality of NOR gates, one less than the number of said output terminals of the quantization stage;
and a plurality of inverters, equal in number to said NOR gates;
said NOR gates and said inverters being operatively connected to said output terminals of the quantization stage to produce an output signal of one binary logic state on a single output terminal of the discriminator stage which corresponds to a particular amplitude range of the analog input voltage on said analog signal input terminal of the quantization stage and output signals of the opposite binary logic state on all the other output terminals of said discriminator stage.

10. An analog-to-digital converted according to claim 1 wherein said discriminator stage comprises:
a plurality of NOR gates, one less than the number of output terminals of the quantization stage, and each having two inputs and an output, one of said inputs of each NOR gate being connected conductively to a corresponding output terminal of the quantization stage;
a plurality of input inverters, equal in number of said NOR gates, individually connected between the other of said inputs of a corresponding NOR gate and the output terminal of the quantization stage which corresponds to the next higher threshold level from that of said corresponding output terminal of the quantization stage which is connected conductively to said one input of the same NOR gate;
said output terminals of the quantization stage, input inverters and NOR gates being operatively connected to produce a unique binary logic state at the output of not more than one of said NOR gates which is different from the binary logic state at the output of all the other NOR gates, corresponding to the highest threshold exceeded by the instantaneous analog input signal on said analog signal input terminal of the quantization stage.

11. An analog-to-digital converter according to claim 3 wherein said discriminator stage comprises:
a plurality of NOR gates, one less than the number of said analog switches, and each having two inputs and an output, one of said inputs of each NOR gate being connected conductively to a corresponding analog switch;
a plurality of input inverters, equal in number to said NOR gates, individually connected between the other of said inputs of a corresponding NOR gate and the analog switch which is closed at the next higher voltage on said analog signal input terminal of the quantization stage from that which closes the analog switch connected conductively to said one input of the same NOR gate;

said analog switches, input inverters and NOR gates being operatively connected to produce a unique binary logic state at the output of not more than one of said NOR gates which is different from the binary logic state at the output of all the other NOR gates, corresponding to the now-closed analog switch which requires the highest voltage at said analog signal input terminal to close.

12. An analog-to-digital converter according to claim 4 wherein said discriminator stage comprises:

a plurality of NOR gates, one less than the number of said output terminals of the quantization stage;

a plurality of inverters operatively connected to input of said NOR gates;

said NOR gates and said inverters being operatively connected to said output terminals of the quantization stage to produce an output signal of one binary logic state on a single output terminal of the discriminator stage which corresponds to a particular amplitude range of the analog input voltage on said analog signal input terminal of the quantization stage and signals of the opposite binary logic state on all the other output terminals of said discriminator stage.

13. An analog-to-digital converter according to claim 6 wherein said discriminator stage comprises;

a plurality of NOR gates, one less than the number of said comparators, and each having two inputs and an output;

and a plurality of input inverters connected between the inputs of the NOR gates and the output terminals of the quantization stages such that there is a single inverter between one input terminal of each NOR gate and the output terminal of the quantization stage for the corresponding magnitude range of the analog input signal and two inverters in series between the other input of each NOR gate and the output terminal fo the quantization stage for the next higher magnitude range of the analog input signal.

14. An analog-to-digital converter according to claim 7 wherein said discriminator stage comprises:

a plurality of NOR gates, one less than the number of output terminals of the quantization stage, and each having two inputs and an output, one of said inputs of each NOR gate being connected conductively to a corresponding output terminal of the quantization stage;

a plurality of input inverters, equal in number to said NOR gates, individually connected between the other of said inputs of a corresponding NOR gate and the output terminal of the quantization stage which corresponds to the next higher threshold level from that of said corresponding output terminal of the quantizastage which is connected conductively to said one input of the same NOR gate;

said output terminals of the quantization stage, input inverters and NOR gates being operatively connected to produce a unique binary logic level at the output of not more than one of said NOR gates which is different from the binary logic level at the outputs of all the other NOR gates, corresponding to the highest threshold exceeded by the instantaneous analog input signal on said analog signal input terminal of the quantization stage.

15. An analog-to-digital converter according to claim 1 wherein:

the number of said digital data output terminals is substantially less than the number of said output terminals of the discriminator stage;

and said encoder stage comprises a plurality of binary logic devices, greater in number than said output terminals of the discriminator stage, operatively connected between said output terminals of the discriminator stage and said digital data output terminals to provide a combination of binary logic states on said digital data output terminals which correspond to the output terminal of the discriminator stage having the output signal of said binary logic state.

16. An analog-to-digital converter according to claim 15 wherein said binary logic devices in said encoder stages are inverters.

17. An analog-to-digital converter according to claim 15 wherein said binary logic devices in said encoder stage are NOR gates.

18. An analog-to-digital converter according to claim 8 wherein:

the number of said digital data output terminals is substantially less than the number of said output terminals of the discriminator stage:

and said encoder stage comprises a plurality of binary logic devices, greater in number than said output terminals of the discriminator stage, operatively connected between said output terminals of the discriminator stage and said digital data output terminals to provide a combination of binary logic states on said digital data output terminals which corresponds to the output terminal of the discriminator stage having the output signal of said one binary logic state.

19. An analog-to-digital converter according to claim 18 wherein said binary logic devices in said encoder stage are inverters.

20. An analog-to-digital converter according to claim 19 wherein said binary logic devices in said encoder stage are NOR gates.

21. An analog-to-digital converter according to claim 9 wherein:

the number of said digital data output terminals is substantially less than the number of said output terminals of the discriminator stage;

and said encoder stage comprises a plurality of binary logic devices, greater in number than said output terminals of the discriminator stage, operatively connected between said output terminals of the discriminator stage and said digital data output terminals to provide a combination of binary logic states on said digital data output terminals which corresponds to the output terminal of the selector stage having the output signal of said one binary logic state.

22. An analog-to-digital converter according to claim 13 wherein:

the number of said digital data output terminals is substantially less than the number of said output terminals of the discriminator stage;

and said encoder stage comprises a plurality of binary logic devices, greater in number than said output terminals of the discriminator stage, operatively connected between said output terminals of the discriminator stage and said digital data output terminals to provide a combination of binary logic states on said digital data output terminals which corresponds to the output terminal of the discriminator stage having the output signal of said one binary logic state.

23. An analog-to-digital converter which does not require a clock and which requires the three following stages, namely:

(a) A separate, discrete, quantization stage including means providing an analog signal input terminal; a plurality of voltage dividers connected in parallel to said input terminal and operatively arranged to provide individual voltages which are different percentages of the analog input signal voltage on said input terminal, and a corresponding plurality of threshold detectors operatively connected individually to said voltage dividers to operate individually in response to the individual voltages provided by said voltage dividers, said threshold detectors operating at different voltage thresholds whereby the number of said threshold detectors in an operated state depends on the magnitude of the analog input signal voltage on said analog signal input terminal;

(b) A separate, discrete discriminator stage having a plurality of output terminals and having NOR gates and inverters operatively connected to said threshold detectors to produce an output signal of one binary logic state on a single output terminal of the discriminator stage which corresponds to a particular magnitude range of the analog signal input voltage on said analog signal input terminal and output signals of the opposite binary logic state on all the other output terminals of said discriminator stage; and (c) A separate, discrete, encoder stage including means providing several digital data output terminals, fewer in number than the output terminals of the discriminator stage; and operatively connected between said output terminals of the discriminator stage and said digital data output terminals to provide different possible combinations of binary logic states on said digital data output terminals, depending upon which one of said output terminals of the discriminator stage has the output signal of said one binary logic state.

24. An analog-to-digital converter which does not require a clock and which requires the three following stages, namely:

(a) A separate, discrete, quantization stage including means providing an analog signal input terminal;
a plurality of resistors connected in parallel with each other between said input terminal and ground;
a corresponding plurality of individual taps on said resistors respectively providing progressively reduced percentages of the total voltage difference between said input terminal and ground;
a corresponding plurality of normally-open analog switches, each having normally-open terminals and an enable terminal operatively arranged to close said normally-open terminals when the voltage on said enable terminal is at least a certain predetermined value, the enable terminal of each analog switch being individually connected conductively to said tap on the corresponding resistor, whereby each said enable terminal receives the voltage on said tap of the corresponding resistor, one of said normally-open terminals of each of said analog switches being grounded;

(b) a separate, discrete, discriminator stage including a plurality of NOR gates, one less than the number of said analog switches, each having two inputs and an output, one of said inputs of each NOR gate being connected conductively to said other normally-open terminal of a corresponding analog switch to have the same voltage as said other normally-open terminal; a plurality of input inverters, equal in number to said NOR gates, individually connected between the other of said inputs of the corresponding NOR gate and said other normally-open terminal of the analog switch which is closed at the next higher voltage on said analog input terminal from that which closes the analog switch connected conductively to said one input of the same NOR gate;
said analog switches, input inverters and NOR gates being operatively connected to produce a unique binary logic state at the output of not more than one of said NOR gates which is different from the binary logic state at the output of each of the other NOR gates, corresponding to the now-closed analog switch which requires the highest voltage at said analog signal input terminal to close; and (c) a separate, discrete, encoder stage including means providing several digital data output terminals fewer in number than said NOR gates; and a multiplicity of inverters operatively connected between the respective outputs of said NOR gates and said digital data output terminals to provide different combinations of binary logic states on said digital data output terminals which correspond individually to the NOR gate whose output has said unique binary logic state.

25. An analog-to-digital converter which does not require a clock and which requires the three following stages, namely:

(a) A separate, discrete, quantization stage including an analog signal input terminal; a plurality of voltage comparators connected to said input terminal and providing successively higher thresholds for the analog input signal on said input terminal, each of said comparators having an output;

(b) a separate, discrete, discriminator stage including a plurality of NOR gates, one less than the number of said voltage comparators, each of said NOR gates having two inputs and an output;
a plurality of input inverters operatively connected to inputs of said NOR gates;
means operatively connecting said input inverters and the inputs of said NOR gates to the outputs of said voltage comparators to produce an output signal of one binary logic state on the output of a single NOR gate which corresponds to a particular amplitude range of the analog signal on said analog signal input terminal and to produce output signals of the opposite binary logic state on the outputs of all the other NOR gates; and (c) a separate, discrete, encoder stage including means providing several digital data output terminals fewer in number than said NOR gates and a multiplicity of inverters operatively connected between the respective outputs of said NOR gates and said digital data output terminals to provide different combinations of binary logic states on said digital data ouput terminals which correspond individually to the NOR gate whose output has said one binary logic state.

26. An analog-to-digital converter according to claim 25 wherein said means operatively connecting said input inverters and the inputs of said NOR gates to the outputs of said voltage comparators comprises:
  a respective analog switch for each voltage comparator, each analog switch having an enable input terminal
  and a respective Zener diode and resistor connected in series with each other between the output of the corresponding voltage comparator and the enable input terminal of the corresponding analog switch.

27. An analog-to-digital converter according to claim 26 wherein said input inverters comprise:
  a single inverter connected between each analog switch and one input terminal of a corresponding NOR gate;
  and two series-connected inverters between the other input terminal of each NOR gate and the analog switch for the voltage comparator at the next higher threshold.

28. An analog-to-digital converter according to claim 25 wherein:
  each of said voltage comparators has a TTL-compatible output connected directly to one input of a corresponding NOR gate;
  and each of said input inverters is connected between the other input of a corresponding NOR gate and the output of the voltage comparator at the next higher threshold.

* * * * *

UNITED STATES PATENT AND TRADEMARK OFFICE
CERTIFICATE OF CORRECTION

PATENT NO. : 4,954,831
DATED : September 4, 1990
INVENTOR(S) : Robin K. Elkins

It is certified that error appears in the above-indentified patent and that said Letters Patent is hereby corrected as shown below:

On the title page under Item (19) United States Patent, "Ekins" should read -- Elkins --.

On the title page Inventor should read
-- (76) Inventor: -- Robin K. Elkins --.

Signed and Sealed this

Seventh Day of June, 1994

Attest:

BRUCE LEHMAN

Attesting Officer     Commissioner of Patents and Trademarks